US012598708B2

(12) United States Patent
Bhatia et al.

(10) Patent No.: US 12,598,708 B2
(45) Date of Patent: Apr. 7, 2026

(54) DETACHABLE SENSOR ASSEMBLY FOR AN ELONGATE CONDUCTOR

(71) Applicant: Caterpillar Inc., Peoria, IL (US)

(72) Inventors: Yash Bhatia, Peoria, IL (US); Rajesh A, Chennai (IN); Zachary W. Newell, Peoria, IL (US); Ahmad Waqqas, Bijnor (IN)

(73) Assignee: Caterpillar Inc., Peoria, IL (US)

( * ) Notice: Subject to any disclaimer, the term of this patent is extended or adjusted under 35 U.S.C. 154(b) by 162 days.

(21) Appl. No.: 18/525,004

(22) Filed: Nov. 30, 2023

(65) Prior Publication Data

US 2025/0185184 A1      Jun. 5, 2025

(51) Int. Cl.
H05K 5/00          (2025.01)
H05K 9/00          (2006.01)
(52) U.S. Cl.
CPC .......... H05K 5/0052 (2013.01); H05K 5/006 (2013.01); H05K 5/0069 (2013.01); H05K 9/0022 (2013.01)
(58) Field of Classification Search
CPC .... H05K 5/0052; H05K 5/006; H05K 5/0069; H05K 9/0022; G01R 15/207; G01R 15/202
See application file for complete search history.

(56) References Cited

U.S. PATENT DOCUMENTS

| | | | |
|---|---|---|---|
| 6,531,862 B1 * | 3/2003 | Stanley ................ | G01R 15/183 |
| | | | 324/114 |
| 6,759,840 B2 * | 7/2004 | Marasch .............. | G01R 15/247 |
| | | | 324/117 R |
| 8,237,435 B2 * | 8/2012 | Hashio ................. | G01R 15/207 |
| | | | 324/246 |
| 8,421,451 B2 * | 4/2013 | Kawaguchi .......... | G01R 15/207 |
| | | | 324/244 |
| 8,709,627 B2 * | 4/2014 | Matsushima ........ | G01R 31/364 |
| | | | 429/61 |
| 9,250,273 B2 * | 2/2016 | Nagao ................. | G01R 19/0092 |
| 9,450,226 B2 | 9/2016 | Morgan et al. | |
| 11,287,451 B2 * | 3/2022 | Tamura .............. | G01R 19/0092 |
| 11,397,196 B2 * | 7/2022 | Sasaki ................ | G01R 19/0092 |

(Continued)

FOREIGN PATENT DOCUMENTS

| | | |
|---|---|---|
| CN | 211428854 U | 9/2020 |
| EP | 2060923 B1 | 11/2014 |

(Continued)

OTHER PUBLICATIONS

Precision Measurement; DC Current, Voltage and Temperature Sensors (IVT Series); Downloaded Nov. 30, 2023; Retrieved at: https://www.isabellenhuetteusa.com/dc-current-and-voltage-sensors-ivt-series/.

*Primary Examiner* — Benyam Ketema
(74) *Attorney, Agent, or Firm* — Harrity & Harrity LLP

(57) ABSTRACT

A sensor assembly for an elongate conductor may include a circuit board with a sensor chip, a field component configured to partially surround the elongate conductor transverse to a longitudinal axis of the elongate conductor, and a housing having a first housing portion to connect to a second housing portion by one or more fasteners. The housing may be configured to retain the elongate conductor, the circuit board, and the field component between the first housing portion and the second housing portion.

20 Claims, 4 Drawing Sheets

(56)     References Cited

U.S. PATENT DOCUMENTS

| 2010/0259255 | A1* | 10/2010 | Hashio | G01R 15/207 |
| | | | | 324/244 |
| 2015/0309080 | A1* | 10/2015 | Chae | G01R 15/202 |
| | | | | 324/251 |
| 2017/0261536 | A1* | 9/2017 | Chae | G01R 15/146 |
| 2020/0217693 | A1 | 7/2020 | Kundman et al. | |
| 2022/0334192 | A1 | 10/2022 | Kendall | |
| 2023/0042505 | A1* | 2/2023 | Hetzmannseder | G01R 15/20 |

FOREIGN PATENT DOCUMENTS

| EP | 2619598 | B1 | 8/2018 |
| KR | 20150100198 | A | 9/2015 |
| KR | 102165359 | B1 | 10/2020 |

\* cited by examiner

300

DETACHABLE SENSOR ASSEMBLY FOR AN ELONGATE CONDUCTOR

TECHNICAL FIELD

The present disclosure relates generally to sensors and, for example, to a detachable sensor assembly for an elongate conductor.

BACKGROUND

Electric drive systems are increasingly used in place of mechanical drive systems both in on-highway and off-highway applications. An electric drive system may include an electric motor as well as a battery to power the electric motor and/or a generator to convert mechanical power into electrical power to power the electric motor. To provide appropriate electrical power to the electric motor, the electric drive system may further include one or more power converters (e.g., alternating current (AC)-direct current (DC) converters, DC-AC converters, DC-DC converters, or the like). Furthermore, one or more bus bars can be used to electrically connect components of the electric drive system. Various electrical characteristics of the electric drive system can be monitored using one or more sensors. In one arrangement, a sensor assembly, including a sensor, may be attached to a bus bar. Generally, the sensor assembly is assembled around the bus bar prior to connecting the bus bar to an electrical device (e.g., a power converter). Once the bus bar is connected, the sensor assembly is mostly inaccessible, and the bus bar needs to be disconnected in order to allow servicing or replacement of the sensor assembly.

U.S. Patent Application Publication No. 20230042505 (the '505 publication) discloses a snap-on assembly that includes a housing that holds an integrated circuit with a sensor. A connector supplies power to the integrated circuit and transmits a signal from the integrated circuit to an electronic circuit. An insert fits into an opening of the housing and secures a conductor in the housing without a mechanical fastener. The sensor measures a magnetic field resulting from a current traveling through the conductor.

In the snap-on assembly of the '505 publication, sensor signals are transmitted externally to the electronic circuit for signal processing. Thus, wired connections between the sensor and the external electronic circuit are used to transmit sensor signals. These wired connections add bulk to the snap-on assembly, and are subject to electrical shorts, wire abrasion, and/or cable disconnection (e.g., due to vibration). Accordingly, the snap-on assembly of the '505 publication may provide unreliable sensing performance.

The sensor assembly of the present disclosure solves one or more of the problems set forth above and/or other problems in the art.

SUMMARY

A sensor assembly for an elongate conductor may include a circuit board with a sensor chip, a field component partially surrounding the elongate conductor transverse to a longitudinal axis of the elongate conductor, and a housing having a first housing portion connected to a second housing portion by one or more fasteners. The housing may retain the elongate conductor, the circuit board, and the field component between the first housing portion and the second housing portion.

An electrical system may include an electrical device, a bus bar electrically connected to the electrical device, and a sensor assembly. The sensor assembly may include a circuit board with a sensor chip, a field component partially surrounding the bus bar transverse to a longitudinal axis of the bus bar, and a housing having a first housing portion connected to a second housing portion by one or more fasteners. The housing may retain the bus bar, the circuit board, and the field component between the first housing portion and the second housing portion.

A sensor assembly for an elongate conductor may include a circuit board with a sensor chip, a field component configured to partially surround the elongate conductor transverse to a longitudinal axis of the elongate conductor, and a housing having a first housing portion to connect to a second housing portion by one or more fasteners. The housing may be configured to retain the elongate conductor, the circuit board, and the field component between the first housing portion and the second housing portion.

DETAILED DESCRIPTION

This disclosure relates to a sensor assembly, which is applicable to any electrical system that uses a bus bar. For example, the electrical system may include a bus bar that is electrically connected to an electrical device, such as a power converter (e.g., a rectifier or an inverter), a battery, or a power distribution unit (e.g., a device that distributes source power to one or more loads), among other examples.

Figure 1:
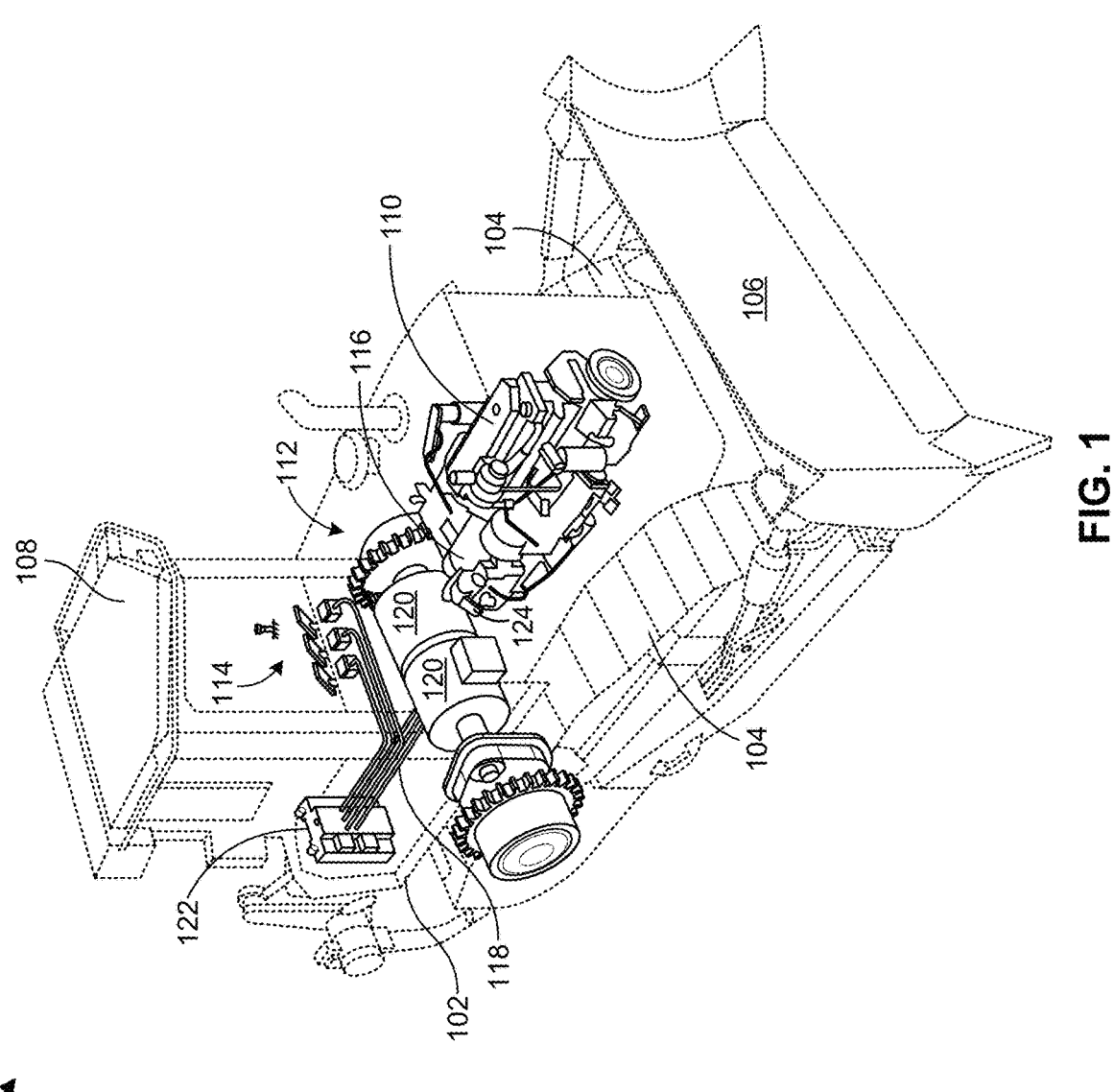
FIG. 1 is a perspective view of an example work machine.

FIG. 1 is a perspective view of an example work machine 100. The work machine 100 may include a tractor, a dozer, a loader, a truck, a motor grader, an excavator, a paver, or another work machine. As shown in FIG. 1, the work machine 100 includes a frame 102, traction elements 104, an implement 106, an operator cab 108, an engine 110, and an electric drive system 112. The traction elements 104 may include tracks, wheels, and/or other traction devices that are movably coupled to the frame 102 and caused to be driven by the electric drive system 112 to propel the work machine 100. The implement 106 may include a blade, a ripper, a winch, a bucket, a sheer, a hammer, and/or another work tool that is movably coupled to the frame 102. The operator cab 108 may be coupled to the frame 102 and may provide a user interface 114 for an operator of work machine 100.

The engine 110 may include a diesel engine, a gasoline engine, a natural gas engine, or another power source configured to generate mechanical power that can be used to enable electric drive system 112. Additionally, or alternatively, the work machine 100 may include a battery. The electric drive system 112 may include a generator 116, a common bus 118, one or more electric motors 120, a controller 122, and a set of sensors 124. The electric drive system 112 may be configured to operate the electric motors 120 of the work machine 100. The generator 116 may include a rotor that is mechanically coupled to the engine 110 and configured to rotate relative to a stator to induce an electrical current (e.g., an alternating current) via one or more windings of the stator. The common bus 118 may include one or more electrical terminals, connectors, bus bars, power converters, and/or other circuit components configured to convert an AC voltage from the generator 116 into a bus voltage (e.g., a DC voltage) that is communicated to the electric motors 120, the controller 122, and/or another electrical load of the work machine 100. In some examples, the common bus 118 may convert the bus voltage into a different DC voltage and/or an AC voltage suited to operate the connected loads.

The sensors 124 are configured to detect electrical characteristics of the electric drive system 112. For example, the sensors 124 may be configured to detect a current at one or more locations of the electric drive system 112. As an example, the sensors 124 may detect a current at the generator 116, at one or more power converters, at an electric motor 120, or the like. The sensors 124 may provide measurements to the controller 122 to facilitate monitoring and control of the electric drive system 112.

As indicated above, FIG. 1 is provided as an example. Other examples may differ from what is described with regard to FIG. 1.

Figure 2:
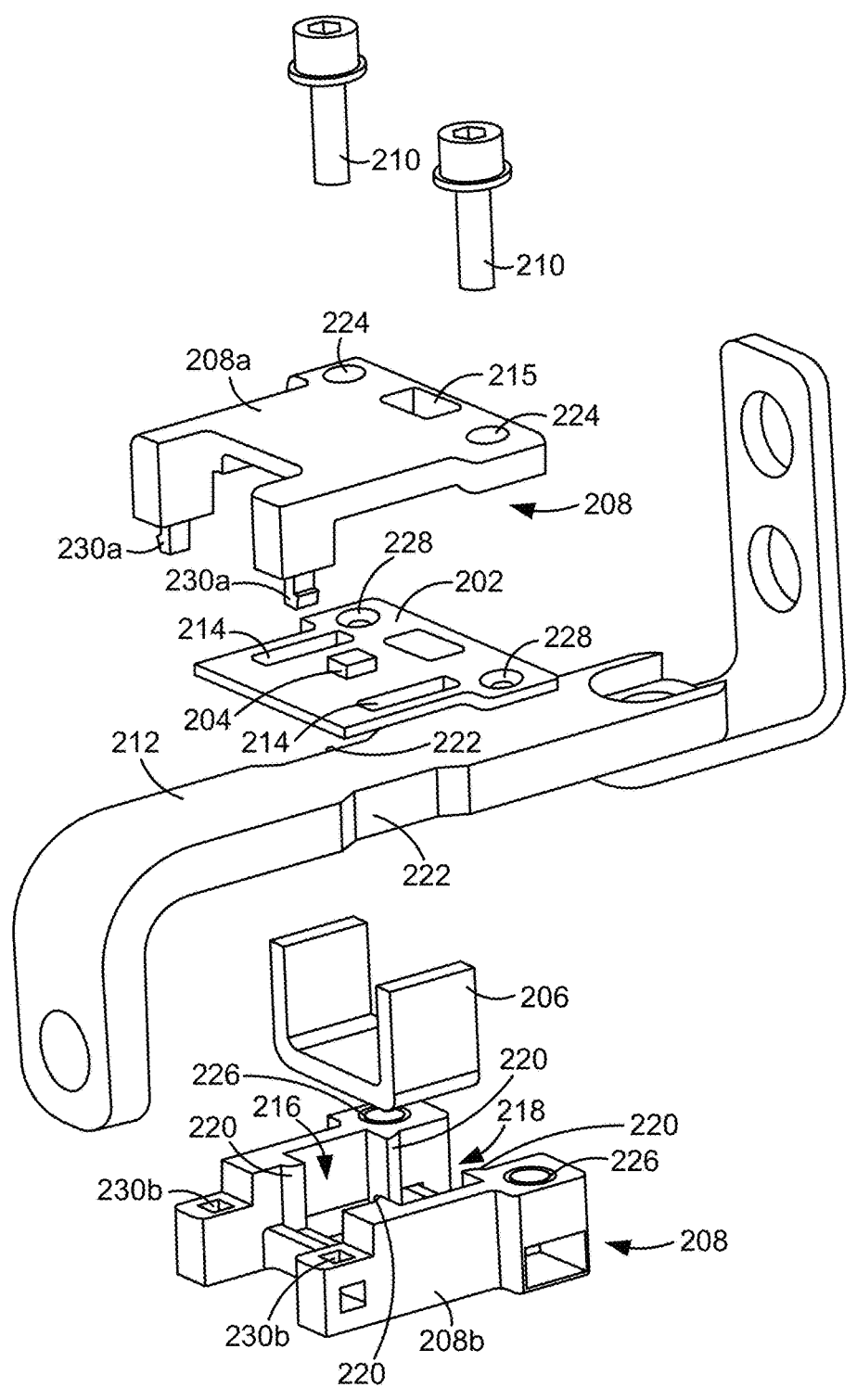
FIG. 2 is an exploded view of an example sensor assembly.

FIG. 2 is an exploded view of an example sensor assembly 200. The sensor assembly 200 includes a circuit board 202 with a sensor chip 204 (e.g., a sensor 124), a field component 206, a housing 208, and/or one or more fasteners 210. The sensor assembly 200 is configured to attach to an elongate electrical conductor 212, such as a bus bar, a cable, or the like.

The circuit board 202 may be a printed circuit board (PCB). The sensor chip 204 may be an integrated circuit (IC) chip surface-mounted on the circuit board 202. The sensor chip 204 may have an analog or a digital interface. The circuit board 202 may include circuitry configured to process a signal generated by the sensor chip 204. For example, the circuit board 202 may be configured to condition the signal (e.g., amplify the signal, filter the signal, convert the signal to a different domain, or the like), format the signal (e.g., in accordance with a particular protocol), and/or interpret the signal, among other examples. As an example, the circuitry may be configured to perform analog to digital conversion on a signal generated by the sensor chip 204. In some examples, the circuitry may enable switching between different sensing modes and/or enable fault detection. The circuit board 202 may include a communication interface (e.g., for digital communication) to facilitate the sending and receiving of data.

The sensor chip 204 may be configured as a sensor and/or a transducer. For example, the sensor chip 204 may be configured as a voltage sensor, a current sensor, a temperature sensor, a magnetic field sensor, a humidity sensor, an arc fault sensor, and/or another type of sensor. In one example, the sensor chip 204 is configured as a Hall sensor. The sensor chip 204 may be programmable to facilitate high accuracy. In some implementations, the circuit board 202 may include multiple sensor chips 204, each configured as a different type of sensor.

The field component 206 is configured to electromagnetically influence an area. For example, the field component 206 (e.g., which may include one or more parts) may be a magnetic flux concentrator (also referred to as a "core") and/or an electromagnetic interference shield (e.g., to reduce cross-talk from neighboring electrical conductors). As an example, an area electromagnetically influenced by the field component 206 may refer to an area in which electromagnetic interference shielding effects provided by the field component 206 are present, or an area into which magnetic flux is concentrated by the field component 206.

The field component 206 may be in a configuration to partially surround the conductor 212 transverse to a longitudinal axis of the conductor 212. For example, the field component 206 may include one or more bars or strips having one or more bends or curves that allow the field component 206 to partially surround the conductor 212. As an example, the field component 206 may have a U-shape (as shown in FIG. 2), a partial ring shape (e.g., a partial rectangular ring or a partial elliptical ring), or the like. For example, implemented in a U-shape, the field component 206 may have a pair of parallel arms extending from opposite ends of a base section. As another example, implemented in a partial ring shape, ends of the field component 206 may be looped toward each other maintaining an air gap between the ends. The field component 206 may be composed of a ferrous material, a conductive material, a magnetic material, or the like.

The housing 208 includes multiple separable housing portions to allow the housing 208 to be assembled onto the conductor 212 and disassembled from the conductor 212. For example, the housing 208 may include a first housing portion 208a (shown as a top portion, but in practice may have any orientation) and a second housing portion 208b (shown as a bottom portion, but in practice may have any orientation). The housing 208 is configured to retain the conductor 212, the circuit board 202, and the field component 206 between the first housing portion 208a and the second housing portion 208b. For example, the first housing portion 208a and the second housing portion 208b, retaining the circuit board 202 and the field component 206, may be attached to the conductor 212 such that the conductor 212 is between the first housing portion 208a and the second housing portion 208b.

In some implementations, as shown in FIG. 2, the first housing portion 208a may connect to the second housing portion 208b orthogonal to a plane defined by the circuit board 202. For example, the first housing portion 208a may be arranged at a first side of the plane, and the second housing portion 208b may be arranged at a second side of the plane opposite the first side. Other connection arrangements of the first housing portion 208a and the second housing portion 208b may be used, such as a connection arrangement described in FIG. 4.

The housing 208 is configured to retain the circuit board 202 to position the sensor chip 204 with respect to the conductor 212 to facilitate detection of characteristics (e.g., a current or a temperature) associated with the conductor 212. Moreover, the housing 208 is configured to retain the circuit board 202 and the field component 206 between the first housing portion 208a and the second housing portion 208b such that the sensor chip 204 is positioned in the area electromagnetically influenced by the field component 206.

In some implementations, when the field component 206 has a U-shape (e.g., when the field component 206 is an electromagnetic interference shield), the area electromagnetically influenced by the field component 206 may be an area between arms of the field component 206. For example, the circuit board 202 may include a pair of slots 214 to either side of the sensor chip 204 (e.g., the sensor chip 204 is positioned between the slots 214). Continuing with the example, a first end (e.g., a first arm) of the field component 206 may extend through a first slot 214 and a second end (e.g., a second arm) of the field component 206 may extend through a second slot 214 such that the sensor chip is between the arms of the field component 206. In some implementations, when the field component 206 has a partial ring shape (e.g., when the field component 206 is a magnetic flux concentrator), the area electromagnetically influenced by the field component 206 may be an air gap between ends of the field component 206 as well as adjacent areas above, below, or to a side of the air gap (e.g., in a flux fringing field associated with the air gap). For example, the housing 208 may be configured to retain the circuit board 202 to align the sensor chip 204 with the air gap.

The first housing portion 208a may have an opening 215 to allow routing of one or more electrical connections (e.g., wires, cables, electrical connectors, or the like) from the circuit board 202 to an external component, such as the controller 122. For example, an electrical connection may extend from the circuit board 202 through the opening 215. In some implementations, the first housing portion 208a may be configured to cover a first portion of the circuit board 202, and to leave exposed a second portion of the circuit board 202 that includes the sensor chip 204. This may improve heat dissipation from the sensor chip 204.

The second housing portion 208b may define a groove 216 retaining the field component 206 and a channel 218 retaining the conductor 212. The groove 216 and the channel 218 may be configured to position the field component 206 transverse to a longitudinal axis of the conductor 212. Moreover, the groove 216 and the channel 218 may be configured to position the field component 206 relative to the conductor 212 such that a gap separates (e.g., electrically isolates) the field component 206 and the conductor 212.

The second housing portion 208b may define one or more angled surfaces 220. For example, the angled surfaces 220 may be on an interior sidewall, of the second housing portion 208b, that is defined by the channel 218. The angled surfaces 220 may follow a contour of notches 222 in opposing sides of the conductor 212 that define a narrowed section in the conductor 212. The second housing portion 208b may securely attach to the narrowed section of the conductor 212 such that the field component 206 partially surrounds the conductor 212 at the narrowed section of the conductor 212. The notches 222 and the angled surfaces 220 may restrict relative movement of the second housing portion 208b and the conductor 212. By restricting movement (e.g., that could be caused by machine vibration), an accuracy of measurements taken by the sensor chip 204 can be improved. In some implementations, the contour of the notches 222 and the angling of the angled surfaces 220 may allow the housing 208 to attach to the conductor 212 in a desired orientation, but prevent the housing 208 from attaching to the conductor 212 in a different orientation.

The first housing portion 208a may have one or more first apertures 224 and the second housing portion 208b may have one or more second apertures 226. Respective fasteners 210 may extend through the first apertures 224 and the second apertures 226 to connect the first housing portion 208a and the second housing portion 208b. A fastener 210 may include a bolt, a screw, a rivet, or the like. The circuit board 202 also may have one or more apertures 228 (e.g., one or more third apertures), and the fasteners 210 may extend through the apertures 228 between the first apertures 224 and the second apertures 226, thereby securing the circuit board 202 to the housing 208. The fasteners 210 securely hold the sensor assembly 200 together, as well as provide secure attachment of the sensor assembly 200 to the conductor 212, thereby improving an accuracy of measurements taken by the sensor chip 204 by restricting movement (e.g., that could be caused by machine vibration).

Additionally or alternatively to the fasteners 210, the housing 208 may include one or more sets of connection elements 230a, 230b. For example, the first housing portion 208a may include a first connection element 230a of a set, and the second housing portion 208b may include a second connection element 230b of the set. The set of connection elements 230a, 230b may include a clip (e.g., a cantilever clip) and a catch configured to engage the clip, as shown in FIG. 2, or other types of connection elements (e.g., magnets).

As indicated above, FIG. 2 is provided as an example. Other examples may differ from what is described with regard to FIG. 2.

Figure 3:
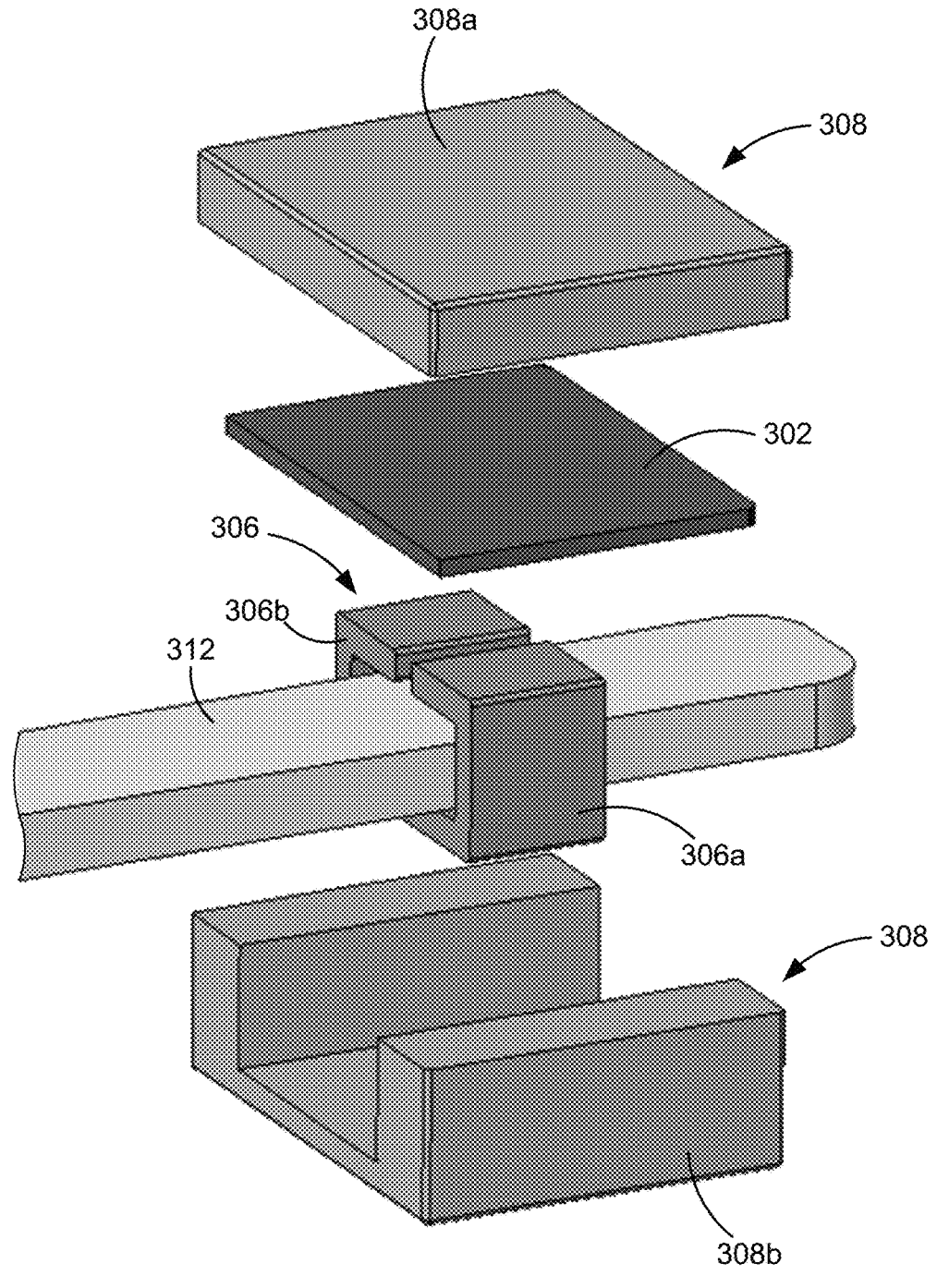
FIG. 3 is an exploded view of an example sensor assembly.

FIG. 3 is an exploded view of an example sensor assembly 300. FIG. 3 shows a simplified representation of the sensor assembly 300. In practice, the sensor assembly 300 may include one or more of the features of the sensor assembly 200 described in connection with FIG. 2. As shown, the sensor assembly 300 includes a circuit board 302, a field component 306, and/or a housing 308 including a first housing portion 308a and a second housing portion 308b, in a similar manner as described in connection with FIG. 2. The sensor assembly 300 is configured to attach to an elongate electrical conductor 312, in a similar manner as described in connection with FIG. 2.

As shown, the field component 306 may have a partial ring shape (e.g., when the field component 306 is a magnetic flux concentrator), as described herein. For example, the field component 306 may include a first field component portion 306a and a second field component portion 306b that together define the field component 306. The field component portions 306a, 306b may have C-shapes (which could also be characterized as sideways U-shapes) that are facing to define a partial ring shape. For example, respective first ends of the field component portions 306a, 306b may be in contact and respective second ends of the field component portions 306a, 306b may have an air gap therebetween. The second housing portion 308b may be configured (e.g., with one or more grooves, as described herein) to retain the field component portions 306a, 306b in a configuration of a partial ring shape.

When the field component 306 is implemented as a partial ring shape, the circuit board 302 may be retained by the housing 308 such that a sensor chip of the circuit board 302 is aligned with the air gap between ends of the field component portions 306a, 306b, as described herein. For example, sidewalls of the second housing portion 308b may extend toward the first housing portion 308a beyond the field component 306, and the circuit board 302 may be disposed on ends of the sidewalls or on a shelf defined in the sidewalls. In some cases, it may be undesirable for the circuit board 302 to have direct contact with the field component 306. Accordingly, the housing 308 may retain the circuit board 302 such that an air gap is maintained between the circuit board 302 and the field component 306.

In some implementations, the sensor assembly 300 may include multiple circuit boards 302. For example, the sensor assembly 300 may include a first circuit board 302 retained in the first housing portion 308a and a second circuit board 302 retained in the second housing portion 308b, such that the field component 306 is between the first circuit board 302 and the second circuit board 302. The first and second circuit boards 302 may include respective sensor chips (e.g., which may implement the same type of sensor or different types of sensors). Moreover, the field component 306 may be configured to define multiple air gaps. For example, respective first ends of the field component portions 306a, 306b may have a first air gap therebetween and respective second ends of the field component portions 306a, 306b may have a second air gap therebetween. Accordingly, the first circuit board 302 may be retained by the housing 308 such that a sensor chip of the first circuit board 302 is aligned with the first air gap, and the second circuit board 302 may be retained by the housing 308 such that a sensor chip of the second circuit board 302 is aligned with the second air gap.

As indicated above, FIG. 3 is provided as an example. Other examples may differ from what is described with regard to FIG. 3.

Figure 4:
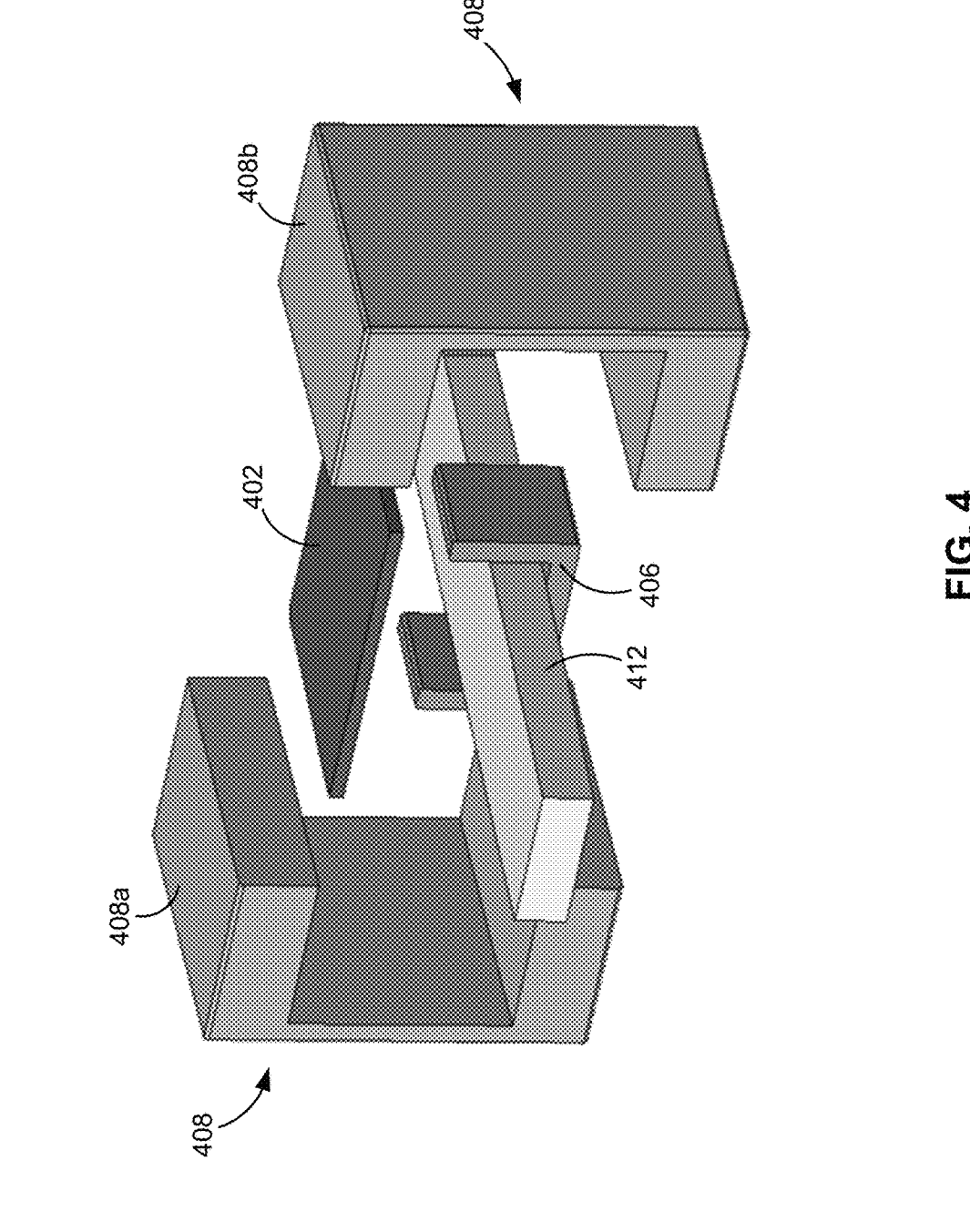
FIG. 4 is an exploded view of an example sensor assembly.

FIG. 4 is an exploded view of an example sensor assembly 400. FIG. 4 shows a simplified representation of the sensor assembly 400. In practice, the sensor assembly 400 may include one or more of the features of the sensor assembly 200 described in connection with FIG. 2. As shown, the sensor assembly 400 includes a circuit board 402, a field component 406, and/or a housing 408 including a first housing portion 408a and a second housing portion 408b, in a similar manner as described in connection with FIG. 2. The sensor assembly 400 is configured to attach to an elongate electrical conductor 412, in a similar manner as described in connection with FIG. 2.

In some implementations, as shown in FIG. 4, the first housing portion 408a may connect to the second housing portion 408b parallel to a plane defined by the circuit board 402. For example, the plane may intersect the first housing portion 408a and the second housing portion 408b. While FIG. 4 shows the field component 406 in a U-shape, the connection arrangement of the first housing portion 408a and the second housing portion 408b described in FIG. 4 may be used for the field component 406 in a partial ring shape or another shape.

As indicated above, FIG. 4 is provided as an example. Other examples may differ from what is described with regard to FIG. 4.

INDUSTRIAL APPLICABILITY

The sensor assembly described herein may be used with any electrical system that uses a bus bar. For example, the sensor assembly may be used with an electric drive system that employs one or more bus bars for electrical connections to a generator, an electric motor, a power converter, a battery, or the like. Generally, a sensor assembly is assembled around a bus bar prior to connecting the bus bar to an electrical device. Once the bus bar is connected to the electrical device, the sensor assembly is mostly inaccessible, and the bus bar needs to be disconnected in order to allow servicing or replacement of the sensor assembly.

The sensor assembly described herein is configured for efficient assembly to, and disassembly from, an elongate electrical conductor, such as a bus bar. For example, the sensor assembly may be attached to the conductor, or detached from the conductor, after the conductor has already been fixed (e.g., welded) to an electrical device. As an example, the sensor assembly can be attached to the conductor, or detached from the conductor, without disassembling the conductor and/or its external connections. Once the housing is attached to the conductor, the first and second housing portions may be easily disassembled and removed from the conductor to facilitate efficient servicing or replacement of the sensor assembly (e.g., replacement of the entire sensor assembly, components thereof, or sub-components thereof) without disconnecting the connector from the electrical device. Moreover, a design of the sensor assembly enables simplified replacement of failed components, while allowing operational components to be reused. Accordingly, the sensor assembly provides simplified serviceability and improves an uptime of the electrical device.

The sensor assembly may include a housing configured to retain a circuit board with a sensor chip between first and second housing portions of the housing. By including the circuit board in the sensor assembly, signal processing may be performed at the sensor assembly, thereby eliminating the need for additional electrical connections, or other potential points of failure, to external circuitry that would otherwise be used to perform external signal processing. Furthermore, the first and second housing portions may attach around the conductor to precisely and securely position the sensor chip with respect to the conductor. This precise and secure positioning enables the sensor chip to detect characteristics of the conductor with high accuracy and improved resilience to machine vibration and/or temperature fluctuations. For example, the precise positioning of the sensor assembly ensures that generated magnetic flux sufficiently interacts with the sensor chip, thereby resulting in highly accurate measurement. Moreover, the sensor assembly is configured to improve a resilience of the sensor chip to cross talk (e.g., from other nearby conductors) and produce high accuracy without needing modifications to the structure of the conductor.

What is claimed is:

1. A sensor assembly for an elongated conductor, comprising:
   a circuit board with a sensor chip;
   a field component partially surrounding the elongated conductor transverse to a longitudinal axis of the elongated conductor; and
   a housing having a first housing portion connected to a second housing portion by one or more fasteners and one or more connection elements,
      the housing retaining the elongated conductor, the circuit board, and the field component between the first housing portion and the second housing portion by the one or more fasteners or the one or more connection elements without the one or more fasteners and the one or more connection elements extending through the elongated conductor.

2. The sensor assembly of claim 1,
   wherein the sensor chip is positioned in an area electromagnetically influenced by the field component.

3. The sensor assembly of claim 1,
   wherein the field component is a magnetic flux concentrator or an electromagnetic interference shield.

4. The sensor assembly of claim 1,
   wherein the field component is U-shaped.

5. The sensor assembly of claim 4,
   wherein the circuit board has a first slot and a second slot, and
      wherein a first end of the field component extends through the first slot and a second end of the field component extends through the second slot.

6. The sensor assembly of claim 1,
   wherein the field component includes a first field component portion and a second field component portion that define an air gap between an end of the first field component portion and an end of the second field component portion.

7. The sensor assembly of claim 6,
   wherein the sensor chip aligns with the air gap.

8. The sensor assembly of claim 1,
   wherein the one or more fasteners connect the first housing portion and the second housing portion via one or more first apertures of the first housing portion, one or more second apertures of the second housing portion, and one or more third apertures of the circuit board.

9. The sensor assembly of claim 1,
wherein the first housing portion has an opening, and an electrical connection to the circuit board extends through the opening.

10. The sensor assembly of claim 1,
wherein the first housing portion connects to the second housing portion orthogonal to a plane defined by the circuit board.

11. The sensor assembly of claim 1,
wherein the first housing portion connects to the second housing portion parallel to a plane defined by the circuit board.

12. An electrical system, comprising:
an electrical device;
a bus bar electrically connected to the electrical device; and
a sensor assembly, comprising:
    a circuit board with a sensor chip;
    a field component partially surrounding the bus bar transverse to a longitudinal axis of the bus bar; and
    a housing having a first housing portion connected to a second housing portion by one or more fasteners and one or more connection elements,
        the housing retaining the bus bar, the circuit board, and the field component between the first housing portion and the second housing portion by the one or more fasteners or the one or more connection elements without the one or more fasteners and the one or more connection elements extending through the bus bar.

13. The electrical system of claim 12,
wherein the bus bar has notches in opposing sides of the bus bar to define a narrowed section of the bus bar.

14. The electrical system of claim 13,
wherein the second housing portion defines one or more angled surfaces that follow a contour of the notches.

15. The electrical system of claim 13,
wherein the field component partially surrounds the bus bar at the narrowed section of the bus bar.

16. The electrical system of claim 12,
wherein the second housing portion is configured to retain the field component and the bus bar such that a gap separates the field component and the bus bar.

17. The electrical system of claim 12,
wherein the second housing portion defines a groove retaining the field component and a channel retaining the bus bar such that a gap separates the field component and the bus bar.

18. A sensor assembly for an elongated conductor, comprising:
a circuit board with a sensor chip;
a field component configured to partially surround the elongated conductor transverse to a longitudinal axis of the elongated conductor; and
a housing having a first housing portion to connect to a second housing portion by one or more fasteners and one or more connection elements,
    the one or more fasteners and the one or more connection elements extend across an exterior portion of the elongated conductor to connect the first housing portion to the second housing portion and to retain the elongated conductor, the circuit board, and the field component between the first housing portion and the second housing portion.

19. The sensor assembly of claim 18,
wherein the field component is a magnetic flux concentrator or an electromagnetic interference shield.

20. The sensor assembly of claim 18,
wherein the second housing portion defines a groove to retain the field component and a channel to retain the elongated conductor such that a gap is to separate the field component and the elongated conductor.

* * * * *